United States Patent
Kosegawa et al.

[11] Patent Number: 6,028,580
[45] Date of Patent: Feb. 22, 2000

[54] LIQUID CRYSTAL DISPLAY DEVICE

[75] Inventors: Seishi Kosegawa, Tenri; Toshihiro Yamashita; Yutaka Takafuji, both of Nara, all of Japan

[73] Assignee: Sharp Kabushiki Kaisha, Osaka, Japan

[21] Appl. No.: 08/719,442

[22] Filed: Sep. 25, 1996

[30] Foreign Application Priority Data

Sep. 28, 1995 [JP] Japan .................................. 7-251318

[51] Int. Cl.[7] ................................................ G09G 3/36
[52] U.S. Cl. .............................................. 345/98; 257/72
[58] Field of Search ........................... 257/72, 341, 350; 359/59; 350/150; 340/752, 784; 357/23.7; 438/199; 345/98

[56] References Cited

U.S. PATENT DOCUMENTS

| | | | |
|---|---|---|---|
| 3,807,831 | 4/1974 | Soref ........................................ | 350/150 |
| 4,481,511 | 11/1984 | Hanmura et al. ........................ | 340/752 |
| 4,617,563 | 10/1986 | Fujiwara et al. ......................... | 340/784 |
| 4,990,981 | 2/1991 | Tanaka et al. ........................... | 357/23.7 |
| 5,173,792 | 12/1992 | Matsueda ................................. | 359/59 |
| 5,305,128 | 4/1994 | Stupp et al. .............................. | 359/59 |
| 5,500,538 | 3/1996 | Yamazaki et al. ....................... | 257/49 |
| 5,528,056 | 6/1996 | Shimada et al. ......................... | 257/72 |
| 5,650,636 | 7/1997 | Takemura et al. ........................ | 257/59 |
| 5,652,452 | 7/1997 | Asano ....................................... | 257/341 |
| 5,731,613 | 3/1998 | Yamazaki et al. ....................... | 257/350 |
| 5,866,445 | 2/1999 | Baumann ................................. | 438/199 |

FOREIGN PATENT DOCUMENTS

| | | |
|---|---|---|
| 6-123896 | 5/1994 | Japan . |
| 6-260650 | 9/1994 | Japan . |

*Primary Examiner*—Matthew Luu
*Assistant Examiner*—Jeff Piziali

[57] ABSTRACT

A driving circuit integrated type active-matrix liquid crystal display device is arranged such that a buffer composed of a P-channel thin film transistor and an N-channel thin film transistor that are connected in series is adopted for the P-channel thin film transistor and an N-channel thin film transistor; at least one of the P-channel thin film transistor and the N-channel thin film transistor is composed of a plurality of thin film transistors that are connected in parallel; and at least one of a power source line and an output line connected to the plurality of thin film transistors connected in parallel is formed in a wiring pattern composed of a main wiring section and a branched wiring section branched into respective thin film transistors. The described arrangement permits a line-shaped defect due to a defective thin film transistor which constitutes a buffer of the drive circuit to be eliminated with ease, while improving a yield of panels.

19 Claims, 13 Drawing Sheets

Wt < Wc

LIQUID CRYSTAL DISPLAY DEVICE

FIELD OF THE INVENTION

The present invention relates generally to a driving circuit integrated type liquid crystal display device provided with a driving circuit deposited on a substrate having formed thereon a plurality of display pixel sections, the driving circuit being provided for driving these display pixel sections.

BACKGROUND OF THE INVENTION

A driving circuit integrated type active-matrix liquid crystal display device includes a plurality of display pixel sections and pixel use thin film transistors for controlling these display pixel sections on a substrate. The driving circuit integrated type active-matrix liquid crystal display device further includes a video signal driving circuit and a scanning signal driving circuit formed on the substrate for driving the pixel use transistors by the dot sequential method.

The described conventional driving circuit integrated type active-matrix liquid crystal display device will be explained with reference to FIG. 2 which explains the present invention. The liquid crystal display device is arranged such that a video signal line 7 from a video signal driving circuit 1 i s connected to a source of a pixel use thin film transistor 4 for controlling a display pixel section 3 composed of a liquid crystal layer, while connected to the gate of the pixel use thin film transistor 4; is a scanning signal line 6 from the scanning signal driving circuit 2. To a drain of the pixel use thin film transistor 4 are connected the display pixel section 3 and an auxiliary capacitance 5.

The video signal driving circuit 1 includes shift registers 9, buffers 10, and an analog switch 11. The scanning signal driving circuit 2 includes shift registers 9 and buffers 10.

For a conventional buffer to be deposited on the video signal driving circuit 1 or the scanning signal driving circuit 2, for example, a buffer 62 as illustrated in FIG. 13 composed of a P-channel thin film transistor 60 and an N-channel thin film transistor 61 which are connected in series between a high potential power source Vdd and a low potential power source Vss may be adopted.

However, the liquid crystal display device provided with such buffer 62 has the following drawbacks. That is, a line-shaped defect due to damage on the thin film transistors 60 and 61 which constitute the buffer 62 is likely to generated, and an improved yield of panels are difficult to be achieved.

Specifically, in the buffer 62 provided in the scanning signal driving circuit 2, if a defect occurs in either one of the transistors 60 and 61, a normal signal would not be inputted to the pixel thin film transistor 4 connected to the defective pixel thin film transistor via the scanning signal line 6. This causes the problem that the display pixel section 3 on the scanning signal line 6 is not lightened properly, thereby generating a line-shaped defect.

The possible causes of such defect of the thin film transistors 60 and 61 which constitute the buffer 62 may be dust, static-electricity, etc. In order to prevent an electrostatic breakdown (breakdown due to the static-electricity) of the thin film transistor, Japanese Laid-Open Patent Application No. 260650/1994 (Tokukaihei 6-260650) discloses a technique of raising a withstanding voltage of the entire thin film transistor by forming an end portion of the thin film semiconductor region that shows a relatively weak resistance to static-electricity by an intrinsic semiconductor or the same conductor as a channel forming region so as to raise the withstanding voltage. Although the described method permits a generation of the defective thin film transistor to be suppressed, it fails to provide a solution to completely prevent a generation of defect.

On the other hand, Japanese Laid-Open Patent Application No. 123896/1994 (Tokukaihei 6-123896) discloses the arrangement where a plurality of thin film transistors which constitute the buffer are connected in parallel in order to achieve improved characteristics of the thin film transistor by the hydrogenating process. Video signal writing switch thin film transistors are shown in FIG. 14 as an example of the arrangement where the thin film transistors are connected in parallel. The video signal wiring switch thin film transistor shown in FIG. 14 includes a thin film transistor 63, a video signal line input 64 and a shift register output line 65, for inputting a shift register output as a gate signal, and a video signal line output 66.

However, with such simple parallel connection, when separating the defective thin film transistor 63 using a laser beam, etc., it is required to cut off the video signal line input 64 or a semiconductor layer in a narrow space between the video signal line output 66 and the shift resistor output line 65. Therefore, it is likely that the shift register output line 65 maybe damaged when cutting off the semiconductor layer, and an improved yield of panels is difficult to be achieved by modifying the buffer.

In general, a buffer has a large sized transistor, which requires a long wire for the gate line, thereby presenting another problem that an electrostatic breakdown of the thin film transistor due to the antenna effect is likely to occur.

SUMMARY OF THE INVENTION

The first object of the present invention is to provide a liquid crystal display device which permits a line-shaped defect due to a defective thin film transistor which constitutes a buffer to be eliminated with ease, thereby achieving an improved yield of panels.

The second object of the present invention is to provide a liquid crystal display device which permits a line-shaped defect due to a defective thin film transistor which constitutes the buffer to be eliminated with ease, and has a structure which permits a generation of a defect in thin film transistors which constitute the buffer to be suppressed, thereby achieving a still improved yield of panels.

In order to achieve the first object, the liquid crystal display device in accordance with the present invention which is provided with a driving circuit deposited on a substrate having formed thereon a plurality of display pixel sections, the driving circuit being provided for driving these display pixel sections is characterized in that:

the driving circuit includes a buffer composed of a P-channel thin film transistor and an N-channel thin film transistor that are connected in series;

at least one of the P-channel thin film transistor and the N-channel thin film transistor is composed of a plurality of thin film transistors that are connected in parallel; and at least one of the power source line and an output line connected to the plurality of thin film transistors connected in parallel is formed in a wiring pattern composed of a main wiring section and branched wiring sections branched from the main wiring into respective thin film transistors.

According to the described arrangement, at least one of the power source line and the output line of the buffer to be connected to a plurality of thin film transistors connected in parallel is formed in a wiring pattern composed of the main wiring section and the branched wiring sections branched from the main wiring section into respective thin film transistors.

Therefore, in the case where a defect with regard to the power source line such as a leakage generated between the gate and the source is generated in any of the thin film transistors connected in parallel, the branched wiring section of the power source line to which the defective TFT is connected is cut off, for example, by projecting thereto a laser beam. As a result, the line-shaped defect due to the defective thin film transistor can be eliminated with ease by separating the defective thin film transistor from the buffer circuit without affecting operations of other thin film transistors. Similarly, in the case where a defect with regard to the output line such as a leakage generated between the gate and the drain is generated in any of the thin film transistors connected in parallel, a line-shaped defect can be eliminated with ease by cutting off the branched wiring section of the output line, for example, by projecting thereto a laser beam. Here, a defect position of the buffer is determined by an analysis of feeble light emission of light or observation of waveform by a probe, etc.

Various types of defects of the thin film transistors possibly occur including a leakage generated between the gate and the source, a leakage generated between the gate and the drain, a leakage generated between the source and the drain, etc. However, the present invention permits any type of defect to be eliminated by adopting the power source line and the output line that are formed in a wiring pattern including the branched wiring sections and by cutting off both the power source line and the output line at the branched wiring section so as to separate the defective thin film transistor.

As a result, the number of inferior panels caused by the line-shaped defect can be reduced, thereby achieving an improved yield of panels.

As a preferred form, the described liquid crystal display device may be arranged such that each thin film transistor connected to the branched wiring section includes a contact for connecting the branched wiring section and a semiconductor layer; and that the branched wiring section is disposed between the main wiring section and the contact.

The described arrangement prevents a problem of damaging the gate electrode section of the thin film transistor, thereby permitting the branched wiring section to be surely cut off. As a result, a still improved yield of panels can be achieved.

In order to achieve the first object, the liquid crystal display device in accordance with the present invention provided with a driving circuit deposited on a substrate having formed thereon a plurality of display pixel sections, the driving circuit being provided for driving these display pixel sections, is characterized in that the driving circuit includes a buffer composed of a P-channel thin film transistor and an N-channel thin film transistor that are connected in series;
   at least one of the P-channel thin film transistor and the N-channel thin film transistor is composed of a plurality of thin film transistors that are connected in parallel;
   the plurality of thin film transistors connected in parallel respectively include a plurality of gates; and
   a gate line for connecting the plurality of gates is formed in a wiring pattern composed of divided wiring sections that are divided for respective gates and a connecting wiring section for connecting respective divided wiring sections provided between respective thin film transistors.

According to the described arrangement, each of the plurality of thin film transistors connected in parallel includes a plurality of gates, and a gate line connecting respective gates is formed in a wiring pattern composed of a divided wiring section divided for each gate and a connecting wiring section for connecting the divided wiring sections formed between the thin film transistors.

The described arrangement permits a line-shaped defect due to the defective thin film transistor to be eliminated with ease when a defect with regard to the gate line such as a leakage between the gate and the drain, a leakage between the gate and the source, etc., is generated in any of the thin film transistors connected in parallel by cutting off the divided wiring section connected to the defective gate, for example, by projecting thereto a laser beam, etc., so as to separate the defective thin film transistor without affecting the operations of other thin film transistors.

Even after one of the divided wiring portions is cut off, a gate signal can be sent to a plurality of gates of the secondary thin film transistors through the divided wiring sections and the connecting wiring sections remaining without being cut off, thereby preventing an effect on the secondary thin film transistors. As a result, a number of inferior panels due to the line-shaped defect can be reduced, thereby achieving an improved yield of panels.

In order to achieve the first object, another liquid crystal display device in accordance with the present invention provided with a driving circuit deposited on a substrate having formed thereon a plurality of display pixel sections, the driving circuit being provided for driving these display pixel sections, is characterized in that:
   the driving circuit includes a buffer composed of a P-channel thin film transistor and an N-channel thin film transistor that are connected in series;
   at least one of the P-channel thin film transistor and the N-channel thin film transistor is composed of a plurality of thin film transistors that are connected in parallel;
   the plurality of thin film transistors connected in parallel respectively include a plurality of gates; and
   a gate line for connecting the plurality of gates is formed in a wiring pattern composed of a divided wiring section divided for each gate and a connecting wiring section for connecting respective ends of the divided wiring sections.

According to the described arrangement, a plurality of thin film transistors connected in parallel respectively include a plurality of gates, and the gate line for connecting respective plurality of gates is formed in a wiring pattern composed of the divided wiring section divided for each gate and the connecting section for connecting respective terminal ends of the divided wiring sections.

The described arrangement permits a line-shaped defect due to the defective thin film transistor to be eliminated with ease upon detecting a defect with regard to the gate line such as a leakage generated between the gate and the drain, a leakage generated between the gate and the source, etc., in any of the thin film transistors connected in parallel by cutting off the divided wiring section connected to the defective gate, for example, by projecting thereto a laser beam, etc., so as to separate the defective thin film transistor from the buffer circuit, without affecting the operations of other thin film transistors.

Even after one of the divided wiring sections is cut off, to a plurality of gates of the secondary thin film transistors, a gate signal is sent through the divided wiring sections and the connecting wiring sections remaining without being cut off, thereby preventing an effect on the secondary thin film transistors.

As a result, a number of inferior panels due to the line-shaped defect can be reduced, thereby achieving an improved yield of panels.

In order to achieve the first object, a still another liquid crystal display device in accordance with the present invention provided with a driving circuit deposited on a substrate having formed thereon a plurality of display pixel sections, the driving circuit being provided for driving these display pixel sections, is characterized in that:

the driving circuit includes a buffer composed of a P-channel thin film transistor and an N-channel thin film transistor that are connected in series;

at least one of the P-channel thin film transistor and the N-channel thin film transistor is composed of a plurality of thin film transistors that are connected in parallel;

the plurality of thin film transistors connected in parallel are formed by using a piece of semiconductor; and at least one of the power source line, an output line and a gate line for connecting the plurality of thin film transistors connected in parallel is formed in a wiring pattern composed of a main wiring section and branched wiring sections branched from the main wiring section into respective thin film transistors.

According to the described arrangement, a plurality of thin film transistors connected in parallel are formed by a plurality of semiconductor pieces that are formed in one integral part, and at least one of the power source line, the output line and the gate line for connecting the plurality of thin film transistors connected in parallel is formed in a wiring pattern composed of the main wiring section and the branched wiring sections branched from the main wiring section into respective thin film transistors.

Therefore, upon detecting a defect with regard to the power source line such as a leakage generated between the gate and the source, a leakage generated between the source and the drain, etc., in any of the thin film transistors connected in parallel, the branched wiring section of the power source line is cut off, for example, by projecting thereto a laser beam. As a result, the line-shaped defect due to the defective thin film transistor can be eliminated with ease by separating the defective thin film transistor from the buffer circuit without affecting operations of other thin film transistors. Similarly, in the case where a defect with regard to the output line such as a leakage generated between the gate and the drain, a leakage generated between the source and the drain is generated in one of the thin film transistors connected in parallel, a line-shaped defect can be eliminated with ease by cutting off the branched wiring section in the output line, for example, by projecting thereto a laser beam. Similarly, in the case where a defect with regard to the gate line occurred, such as a leakage generated between the gate and the source, a leakage generated between the gate and the drain, etc., a line-shaped defect can be eliminated with ease by cutting off the branched wiring section in the gate line, for example, by projecting thereto a laser beam, etc.

The described arrangement further permits any type of defect to be eliminated by adopting the power source line and the output line that are formed in a wiring pattern including the branched wiring sections and by cutting off both the power source line and the output line at the branched wiring section so as to separate the defective thin film transistor.

As a result, the number of inferior panels caused by the line-shaped defect can be reduced, thereby achieving an improved yield of panels. Furthermore, as a plurality of thin film transistors connected in parallel are formed by a plurality of semiconductor pieces that are formed in one integral part, the buffer can be small-sized compared with the arrangement where the semiconductors which constitute the thin film transistor are separately provided.

In order to achieve the second object, the liquid crystal display device in accordance with the present invention having any of the described arrangements may be characterized in that a gate line connected to the buffer includes a gate electrode section disposed in the thin film transistor and an intermediate wiring section for connecting between gate electrode sections of the thin film transistors; and the intermediate wiring section is composed of a thin film layer that is different from a thin film layer adopted in the gate electrode section, and the thin film layer of the intermediate wiring section is in contact with the thin film layer of the gate electrode section in a vicinity of a thin film transistor main body, with a contact surface between them parallel to the substrate.

According to the described arrangement, the intermediate wiring section is formed by the thin film layer different from the thin film layer used in the gate electrode section, and the thin film layer of the intermediate wiring section is in contact with the thin film layer of the gate electrode section in a vicinity of the thin film transistor main body with a contact face between them parallel to the substrate. As a result, the intermediate wiring section, which is likely to induce the electrostatic breakdown of the thin film transistor due to the antenna effect in the manufacturing process, can be formed before manufacturing the gate electrode section, and this permits the electrostatic breakdown of the thin film transistor to be effectively suppressed, thereby providing a liquid crystal display device with an improved yield of panels.

The novel features which are considered as characteristic of the invention are set forth in particular in the appended claims. The improved treatment method, as well as the construction and mode of operation of the improved treatment apparatus, will, however, be best understood upon perusal of the following detailed description of certain specific embodiments when read in conjunction with the accompanying drawings which are given by the way of illustration only, and thus are not limitative of the present invention.

BRIEF DESCRIPTION OF THE DRAWINGS

FIG. 1(a) and FIG. 1(b) show one embodiment of the present invention, wherein FIG. 1(a) is a plan view of a buffer of a driving circuit deposited on a substrate of a driving circuit integrated type liquid crystal display device taken from the side of a back surface of the substrate excluding therefrom the substrate and an insulating film; and FIG. 1(b) is an cross-sectional view of essential parts of the buffer.

FIG. 5(a) and FIG. 5(b) show still another embodiment of the present invention, wherein FIG. 5(a) is a plan view of a buffer of a driving circuit deposited on a substrate of a driving circuit integrated type liquid crystal display device taken from the side of a back surface of the substrate excluding therefrom the substrate and an insulating film; and FIG. 5(b) is an cross-sectional view of essential parts of the buffer.

DETAILED DESCRIPTION OF THE PREFERRED EMBODIMENTS

First Embodiment

The following descriptions will discuss one embodiment of the present invention in reference to FIG. 1 through FIG. 4.

Figure 2:
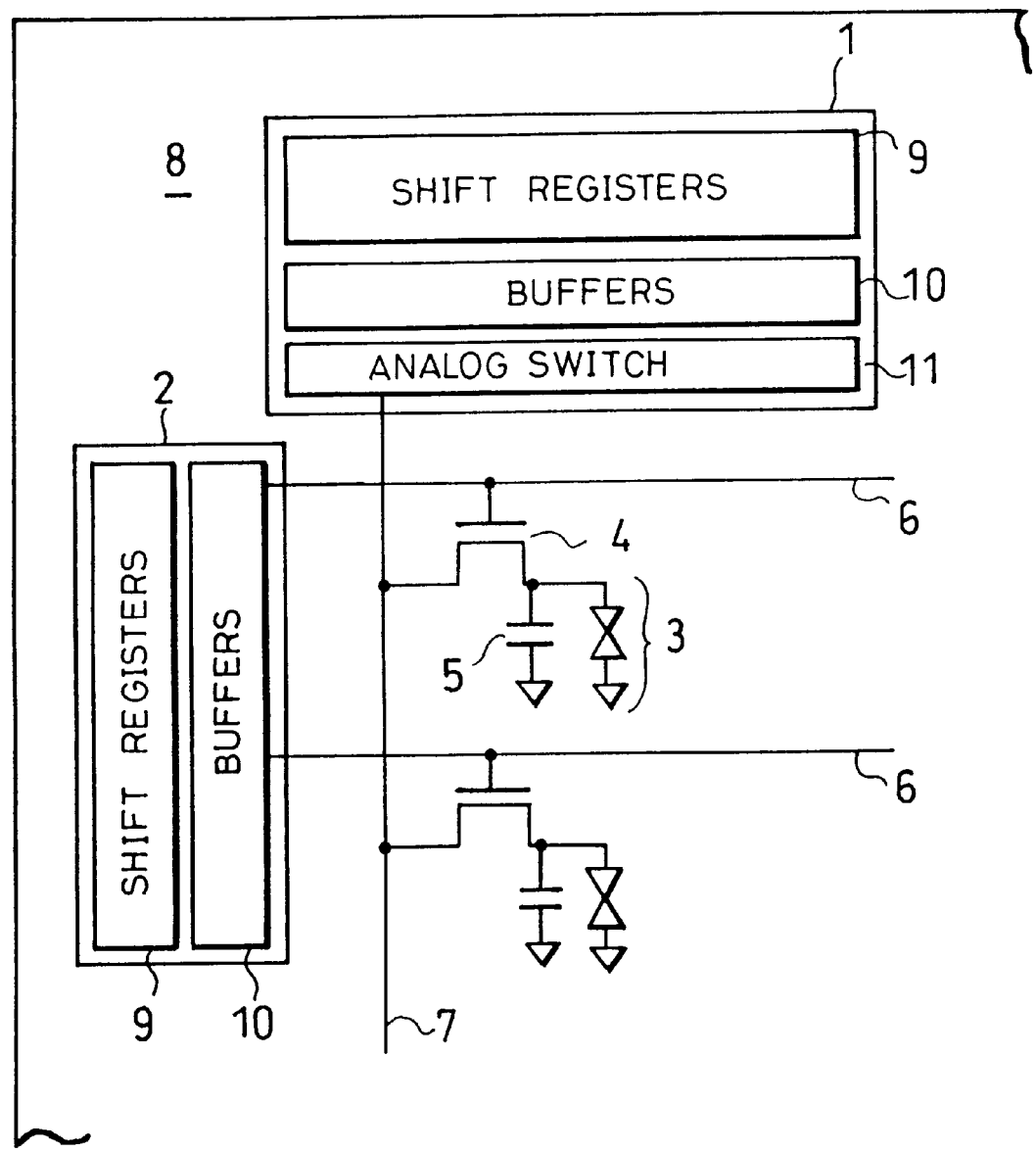
FIG. 2 is an explanatory view showing an arrangement of the driving circuit integrated type liquid crystal display device.

As shown in FIG. 2, a driving circuit integrated type active-matrix type liquid crystal display device in accordance with the present embodiment includes a video signal driving circuit 1 and a scanning signal driving circuit 2 disposed on a substrate 8 having formed thereon a plurality of display pixel sections 3. The liquid crystal display device is arranged so as to drive a pixel use thin film transistor 4, formed at a portion where a video signal line 7 and a scanning signal line 6 are crossed, by the video signal driving circuit 1 and the scanning signal driving circuit 2 so as to perform a display on the display pixel section 3 including a liquid crystal layer.

Connected to the source of the pixel use thin film transistor 4 is the video signal line 7 from the video signal driving circuit 1, while connected to the gate of the pixel use thin film transistor 4 is the scanning signal line 6 from the scanning signal driving circuit 2. Further, connected to the drain of the pixel use thin film transistor 4 are an auxiliary capacitance 5 and the display pixel section 3. Here, a voltage to be applied to the auxiliary capacitance 5 is also controlled by the pixel use thin film transistor 4.

The video signal driving circuit 1 includes buffers 10, shift registers 9 for inputting a control signal to each buffer 10 and an analog switch 11. The buffer 10 is connected to the corresponding video signal line 7 for inputting a video signal to the pixel use thin film transistor 4. In the video signal driving circuit 1, one buffer 10 and one shift register 9 are provided for each video signal line 7.

The scanning signal driving circuit 2 includes buffers 10 and shift registers 9. The buffer 10 is connected to corresponding signal line 6 for inputting a scanning signal to the pixel use thin film transistor 4. The shift register 9 is provided for inputting a control signal to respective buffers 10. In the scanning signal driving circuit 2, one buffer 10 and one shift register 9 are provided for each scanning signal line 6.

Figure 1A:
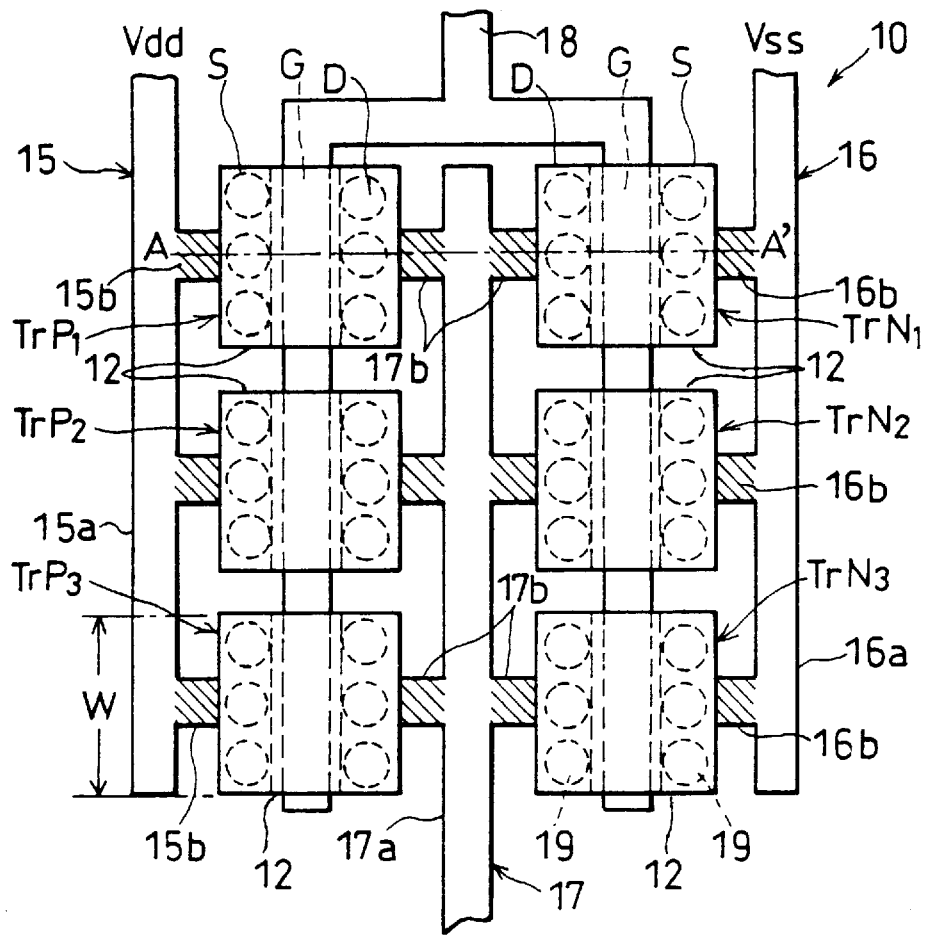

Each buffer 10 includes a P-channel thin film transistor and an N-channel thin film transistor which are connected in series between a high potential power source Vdd and a low potential power source Vss. As shown in FIG. 1(a), the liquid crystal display device in accordance with the present embodiment adopts the P-channel thin film transistor composed of three P-channel thin film transistors $TrP_1$ through $TrP_3$ connected in parallel, and the N-channel thin film transistor composed of three N-channel thin film transistors $TrN_1$ through $TrN_3$ connected in parallel.

Figure 1B:
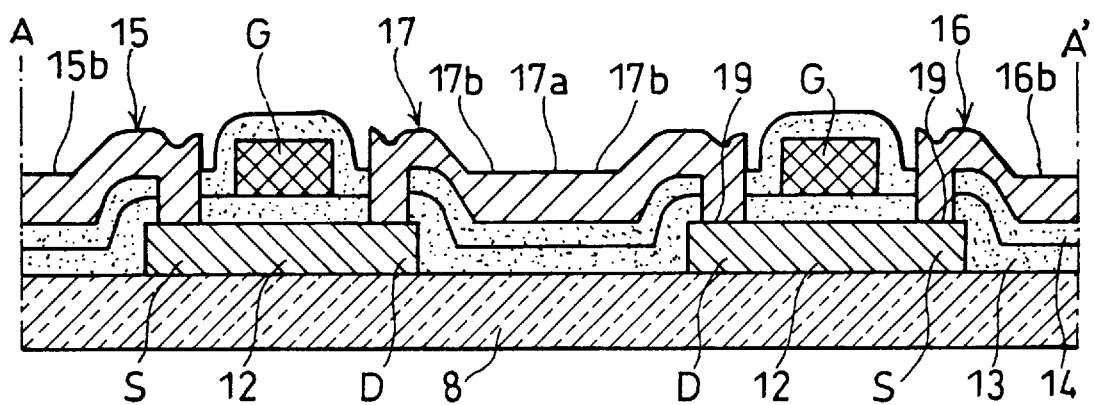

FIG. 1(a) is a plan view of the buffer 10 taken from the side of the substrate 8, and FIG. 1(b) is a cross-sectional view taken along lines A–A' of the buffer 10.

As shown in FIG. 1(a) and FIG. 1(b), each buffer 10 includes semiconductor layers 12, insulating films 13 and insulating films 14 and gate electrode sections G that are formed on the substrate 8. The buffer 10 also includes a power source line 15 on the side of the high potential power source Vdd connected to the source S of the semiconductor layer 12 on the side of the P-channel, a power source line 16 on the side of the low potential power source Vss connected to the source S of the semiconductor layer 12 on the side of the N-channel and an output line 17 connected to the drain D of each semiconductor layer 12 for outputting a signal. The buffer 10 further includes a contact 19 for connecting the power source line 15, the P-channel use semiconductor layer, the power source line 16, and the N-channel use semiconductor layer, or connecting the output line 17 and each semiconductor layer 12. The substrate 8, the insulating films 13 and the insulating films 14 are omitted in FIG. 1(a).

As shown in FIG. 1(a), the power source line 15 is formed in a wiring pattern composed of a straight line main wiring section 15a and a plurality of branched wiring sections 15b (shown by hatching in FIG. 1(a)) branched from the main wiring section 15a into the sources S of the respective thin film transistors $TrP_1$ through $TrP_3$. The straight line main wiring section 15a is formed so as not to be in contact with the respective thin film transistors $TrP_1$ through $TrP_3$, and one end of the main wiring section 15a is connected to the high potential power source Vdd. Each branched wiring section 15b is a straight line wiring section formed so as to cross the main wiring section 15a at right angle.

The power source line 16 is formed in a wiring pattern composed of a single straight line main wiring section 16a and a plurality of branched wiring sections 16b branched from the main wiring section 16a into the source S of the thin film transistors $TrN_1$ through $TrN_3$ (shown by hatching in FIG. 1(a)). The straight line main wiring section 16a is formed parallel to the main wiring section 15a so as not to be in contact with the respective transistors $TrN_1$ through $TrN_3$, and one end of the main wiring section 16a is connected to the low potential power source Vss. Each branched wiring section 16b is a straight line wiring section formed so as to cross the main wiring section 16a at right angle.

The output line 17 is formed in a wiring pattern composed of a single straight line main wiring section 17a and a plurality of branched wiring sections 17b branched from the main wiring section 17a into the drains D of the thin film transistors $TrP_1$ through $TrP_3$ and $TrN_1$ through $TrN_3$ (shown by hatching in FIG. 1(a)). The straight line main wiring section 17a is formed parallel to the main wiring sections 15a and 16a so as not to be in contact with respective thin film transistors $TrN_1$ through $TrN_3$. The main wiring section 17a has one end which serves as an output terminal. Each branched wiring section 17b is a straight line wiring section formed so as to cross the main wiring section 17a at right angle.

These branched wiring sections 15b through 17b are arranged so as to be cut off to be separated from a defective thin film transistor if a defect occurs in any of the thin film transistors $TrP_1$ through $TrP_3$, and $TrN_1$ through $TrN_3$. Therefore, the branched wiring sections 15b, 16b and 17b are disposed respectively between the main wiring sections 15a, 16a and 17a and the contact 19 so as to prevent the gate electrode section G from being damaged when cutting off by a laser beam. Here, it is preferable that the width of the branched wiring sections 15b, 16b and 17b is set in a range of from 2 μm to ½ of the channel width W of the thin film transistors $TrP_1$ through $TrP_3$, and $TrN_1$ through $TrN_3$ in consideration of the design rule in the manufacturing process and a convenience in cutting off by a laser beam.

As shown in FIG. 1(a), the buffer 10 includes a gate line 18 provided for each channel. The gate line 18 is provided for applying a control (gate) signal from the shift register 9 to the gate electrode sections G of respective thin film transistors $TrP_1$ through $TrP_3$, and $TrN_1$ through $TrN_3$. The gate line 18 is composed of the same thin film layer as respective gate electrode sections G of respective thin film transistors $TrP_1$ through $TrP_3$, and $TrN_1$ through $TrN_3$. The gate line 18 which includes each gate electrode section G as a part of a wiring is a straight line wiring formed parallel to the main wiring sections 15a and 16a, and one end of the gate line 18 is connected to the shift register 9.

In the liquid crystal display device provided with the buffer 10 of the described arrangement, upon detecting a line-shaped defect, a line-shaped defect can be eliminated in the following manner.

Figure 3:
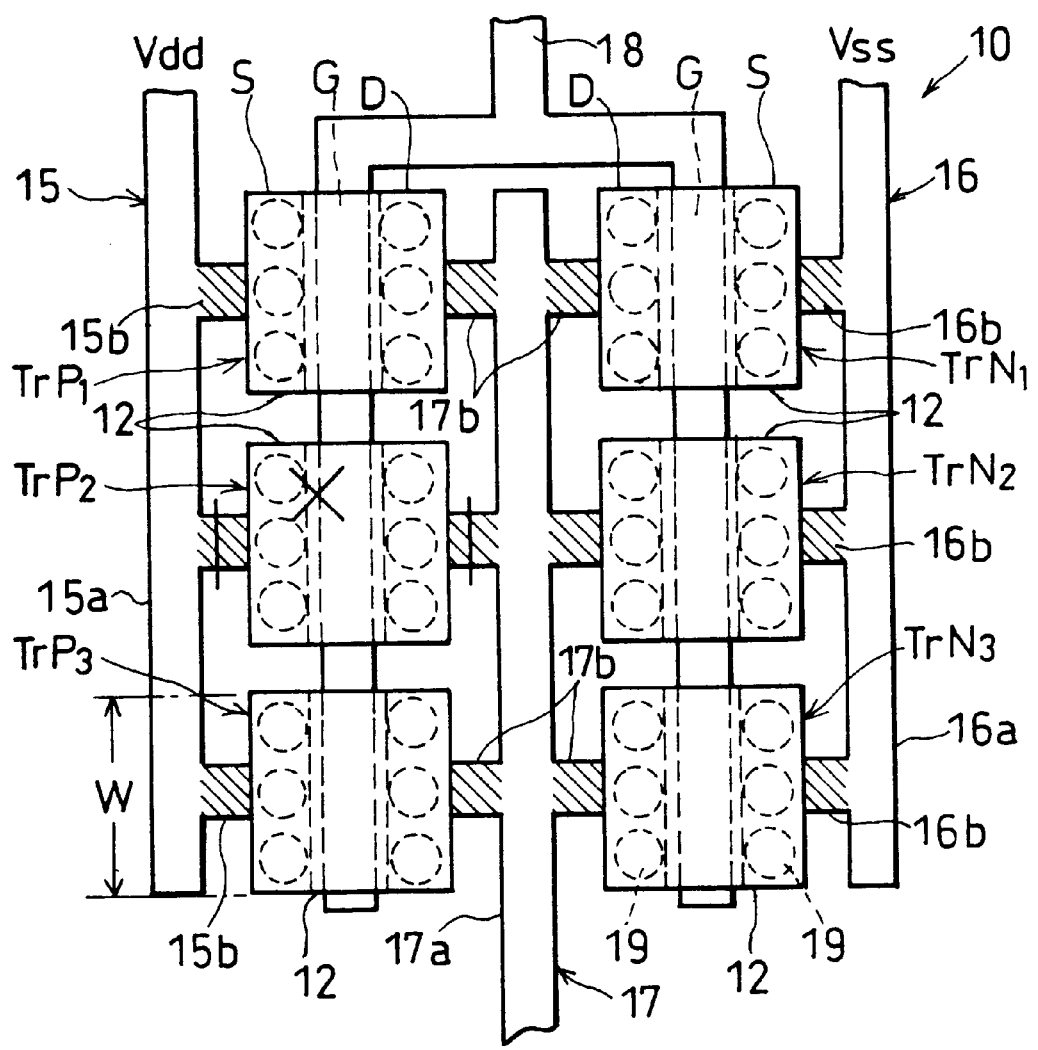
FIG. 3 is a plan view of the buffer shown in FIG. 1(a) and FIG. 1(b) from which the defect has been eliminated, taken from the side of the back surface of the substrate excluding the substrate and an insulating film.
Figure 4:
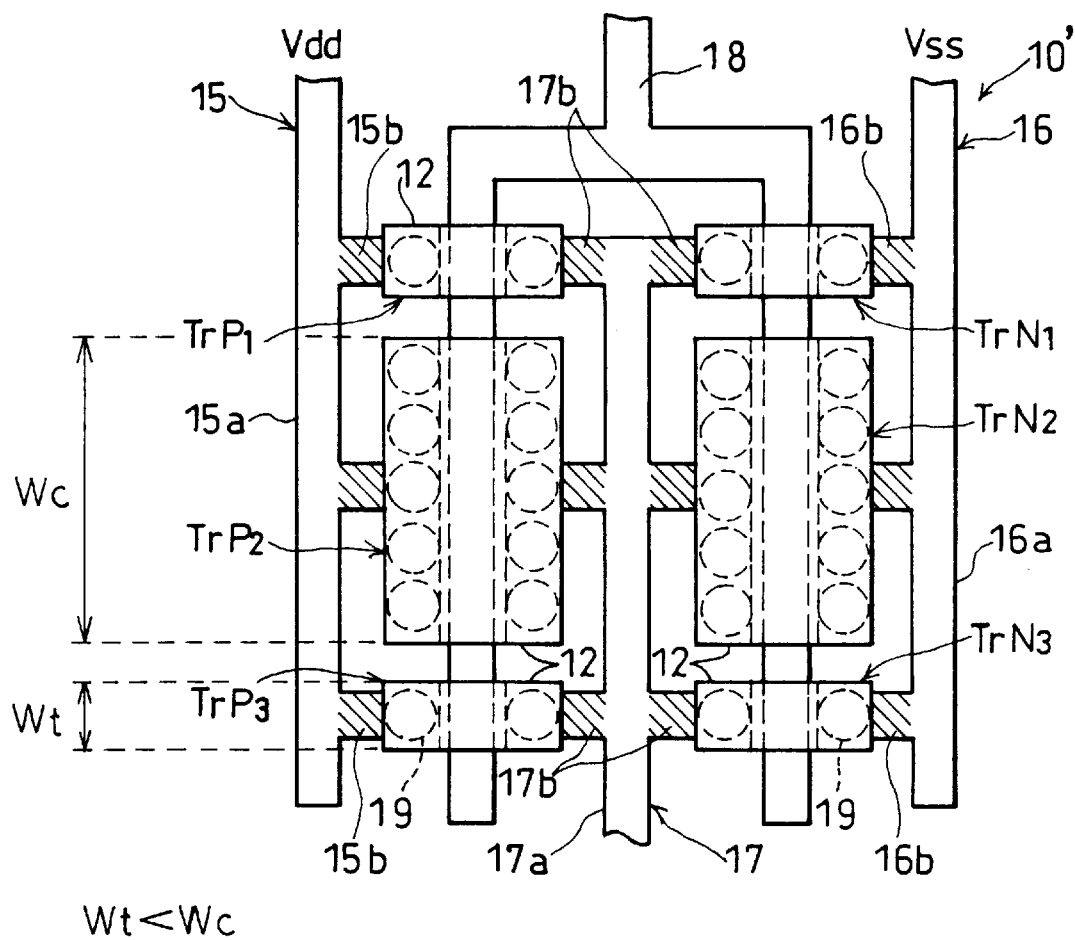
FIG. 4 shows another embodiment of the present invention, and is a plan view of a buffer of a driving circuit deposited on a substrate of a driving circuit integrated type liquid crystal display device taken from the side of a back surface of the substrate excluding the substrate and an insulating film.

First, the buffer 10 is checked by observing a waveform by a probe or analyzing a feeble light emission. As a result, as shown in FIG. 3, if it is detected that a defect occurred at a portion marked with x of the thin film transistor $TrP_2$, the branched wiring section 15b of the power source line 15 and the branched wiring section 17b of the output line 17 which are connected to the defective thin film transistor $TrP_2$ are cut off, for example, by projecting thereto a laser beam, etc., so as to separate the defective thin film transistor $TrP_2$. Namely, the thin film transistor $TrP_2$ is electrically separated from the buffer circuit.

As the defective thin film transistor $TrP_2$ is cut off, the buffer 10 is permitted to output normal signals through the remaining two P-channel thin film transistors $TrP_1$ and $TrP_3$ and three N-channel thin film transistors $TrN_1$ through $TrN_3$, thereby eliminating the line-shaped defect.

The explanations have been given through the case of separating the thin film transistor to eliminate a defect generated in the thin film transistor $TrP_2$. However, the described method of eliminating a defective thin film transistor can be applied to a defect generated in any other thin film transistors $TrP_1$, $TrP_3$, $TrN_1$, $TrN_2$ and $TrN_3$.

In the arrangement of the present embodiment, it is preferable to select the channel width W of respective thin film transistors $TrP_1$ through $TrP_3$, and $TrN_1$ through $TrN_3$ so that they can be properly operated as respective buffers 10 for the video signal driving circuit 1 and the scanning signal driving circuit 2 even with the remaining two P-channel thin film transistors and two N-channel thin film transistors.

As described, in the driving circuit integrated type active-matrix liquid crystal display in accordance with the present embodiment, the respective buffers 10 for the video signal driving circuit 1 and the scanning signal driving circuit 2 respectively include the P-channel thin film transistors and N-channel thin film transistors respectively composed of a plurality of thin film transistors $TrP_1$ through $TrP_3$ and a plurality of thin film transistors $TrN_1$ through $TrN_3$ connected in parallel, where the power source lines 15, 16 and 17 of respective thin film transistors $TrP_1$ through $TrP_3$ and $TrN_1$ through $TrN_3$ are formed in wiring patterns respectively composed of main wiring sections 15a, 16a and 17a and branched wiring sections 15b, 16b and 17b respectively formed between the main wiring sections 15a, 16a and 17a and the contact 19.

Therefore, upon detecting a defect generated in any of the thin film transistors $TrP_1$ through $TrP_3$, and $TrN_1$ through $TrN_3$, by cutting off the branched wiring sections 15b, 16b or 17b that is connected to the defective thin film transistor, only the defective thin film transistor can be separated, and the line-shaped defect can be eliminated with ease without disturbing input and output of the signals with respect to other normally operated thin film transistors nor damaging the gate electrode sections G.

In the present embodiment, the power source lines 15 and 16 and the output line 17 of the buffer 10 are all formed in a wiring pattern composed of the main wiring sections 15a, 16a and 17a and the branched wiring sections 15b, 16b and 17b that are branched therefrom. Therefore, by cutting off both the power source lines 15 and 16 and the output line 17, a defect due to a leakage generated between the gate and the source, a leakage generated between the gate and the drain, a leakage generated between the source and the drain, etc., can be eliminated. As described, any defect with regard to the power source lines 15 and 16 such as a leakage generated between the gate and the source can be eliminated only by cutting off the branched wiring section 15b or 16b of the power source line 15 or 16. Further, any defect with regard to the output line 17 such as a leakage generated between the gate and the drain, etc., can be eliminated by cutting off only the branched wiring section 17b of the output line 17. In consideration of the above, when it is determined that a leakage is likely to occur between the gate and the drain, it may be arranged so as to form only the output line 17 in the described wiring pattern. Namely, it is permitted to form either one of the lines in the described pattern in consideration of the defect that is most likely to occur.

In the present embodiment, a plurality of thin film transistors are adopted for each channel. However, when it is determined that a defect is likely to occur in only either one of the channels, it may be arranged such that only the channel in which a defect is more likely to occur is composed of a plurality of thin film transistors. The same can be said for all the arrangements of the below-discussed preferred embodiments of the present invention.

Based on the test results, it has been found that among a plurality of thin film transistors connected in parallel in each channel, an electrostatic breakdown is more likely to occur in the thin film transistors at the end sides than the thin film transistor on the inner side. Therefore, the buffer 10' shown in FIG. 4 may be adopted wherein among three P-channel thin film transistors $TrP_1$ through $TrP_3$ and three N-channel thin film transistors $TrN_1$ through $TrN_3$, the thin film transistors $TrP_1$, $TrP_3$, $TrN_1$ and $TrN_3$ are used as dummy transistors by setting the channel width Wt of the thin film transistors $TrP_1$, $TrP_3$, $TrN_1$ and $TrN_3$ formed on the end sides smaller than the channel width Wc of other thin film transistors.

This not only permits the line-shaped defect to be eliminated but also permits a deterioration in performances of the buffer to be prevented.

Second Embodiment

The following descriptions will discuss another embodiment of the present invention in reference to FIG. 5. Here, members having the same function as those of the first embodiment will be designated by the same reference numerals, and thus the descriptions thereof shall be omitted here.

In general, a buffer has a large-sized transistor and this requires a longer wiring for a gate line. The described unfavorable feature may cause such problem that electrostatic breakdown of the thin film transistor due to occur the antenna effect is likely to occur in the process of forming the gate lines. Specifically, the gate lines connecting respective gate electrode sections of thin film transistors serve as an antenna and absorb an externally applied electromagnetic field. The electromagnetic field causes static-electricity to generate in the thin film transistor, which induces an insulating breakdown of the insulating film.

Figure 5A:
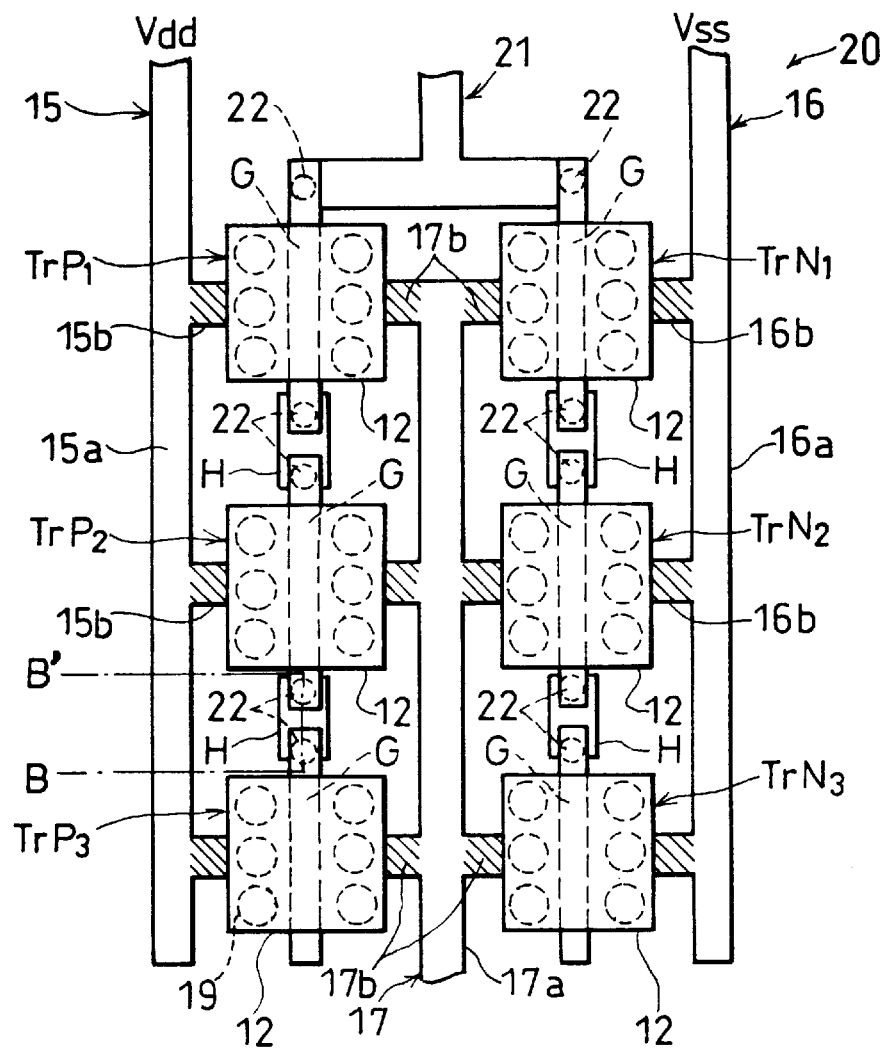

A driving-circuit integrated type active-matrix liquid crystal display device in accordance with the present embodiment includes a buffer 20 shown in FIG. 5(a).

The buffer 10 in the liquid crystal display device of the first embodiment is arranged such that the gate electrode sections G of the respective thin film transistors $TrP_1$ through $TrP_3$ and $TrN_1$ through $TrN_3$ and the wiring sections (intermediate wiring sections) for connecting the respective gate electrode sections G are composed of the same thin film layers.

Figure 5B:
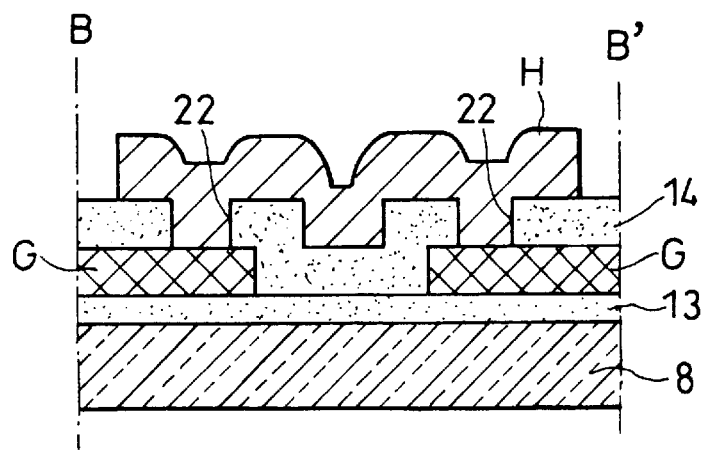

In contrast, a buffer 20 in the liquid crystal display device in accordance with the present embodiment is arranged so as to include a gate line 21 wherein all the wiring portions for connecting respective gate electrode sections G are formed by the thin film layer H different from the gate electrode section G a s shown in FIG. 5(b) The thin film layer H of the wiring section and each gate electrode G are connected via a through hole 22 in a vicinity of the thin film transistor main body.

The thin film layer s which form respective gate electrode sections G of the gate lines 21 are formed at predetermined intervals and are connected via the thin film layer H. As shown in FIG. 5(b), the thin film layer of each gate electrode section G and the thin film layer H are formed so as to have different distances from the substrate 8, and are connected each other with a contact surface parallel to the substrate. These thin film layers are formed in such a manner that after the thin film layer H is formed, the thin film layer for use in each gate electrode section G is formed so as to be in contact with a part of the surface of the thin film layer H on the side of the substrate 8.

As long as the thin film layer H is formed before the thin film layers G are formed, the material, shape, thickness, etc., of the thin film layer H are not particularly limited. Specifically, the material of the thin film layer H may be the same as that adopted in the thin film layer of the power source line 15, 16 or the output layer 17, or may be the same as the thin film layer G.

As described, the liquid crystal display device in accordance with the present invention is arranged such that after forming the thin film layer H of the wiring section for connecting respective gate electrode sections G, which is likely to induce the electrostatic breakdown of the thin film transistor due to the antenna effect, the gate electrode sections G are formed. The described arrangement of the liquid crystal device of the present invention suppresses a generation of the electrostatic breakdown in the thin film transistors $TrP_1$ through $TrP_3$ and $TrN_1$ through $TrN_3$ due to the antenna effect in the process of forming the gate lines 21.

As a result, the effect that a generation of a line-shaped defect due to the electrostatic breakdown of the thin film transistors $TrP_1$ through $TrP_3$ and $TrN_1$ through $TrN_3$ can be suppressed is achieved in addition to the effect achieved from the arrangement of the first embodiment that the line-shaped defect can be effectively eliminated with ease, thereby achieving a significantly improved yield of panels. Needless to mention, the described arrangement of the gate line 21 can be applied to respective gate lines adopted in the below-discussed third through fifth embodiments.

Additionally, a part of the wiring section connecting respective gate electrode portions G may be formed by a thin film layer H different from that of each gate electrode section G.

Third Embodiment

Figure 6:
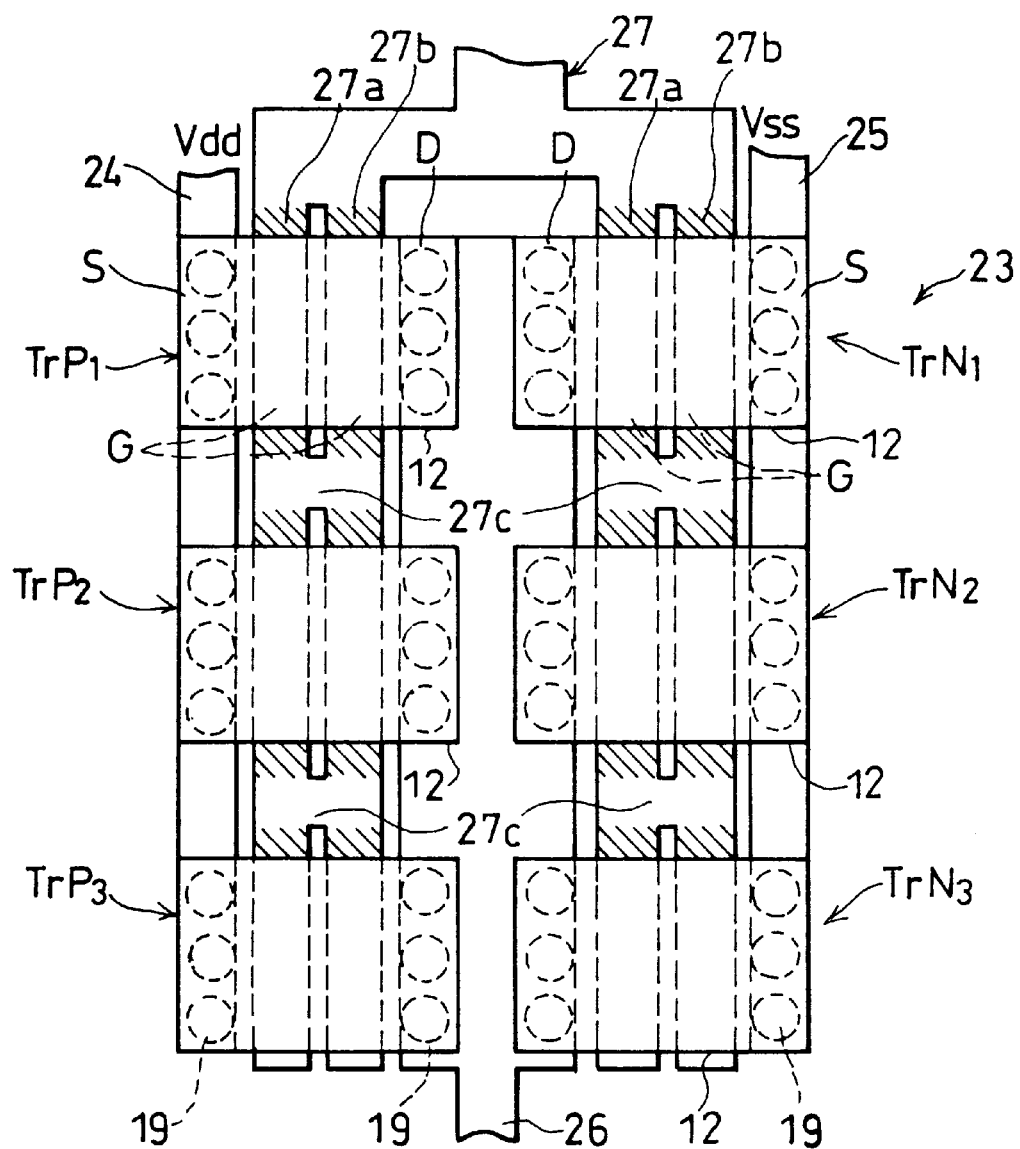
FIG. 6 shows still another embodiment of the present invention, and is a plan view of a buffer of a driving circuit deposited on a substrate of a driving circuit integrated type liquid crystal display device taken from the side of a back surface of the substrate excluding the substrate and an insulating film.
Figure 7:
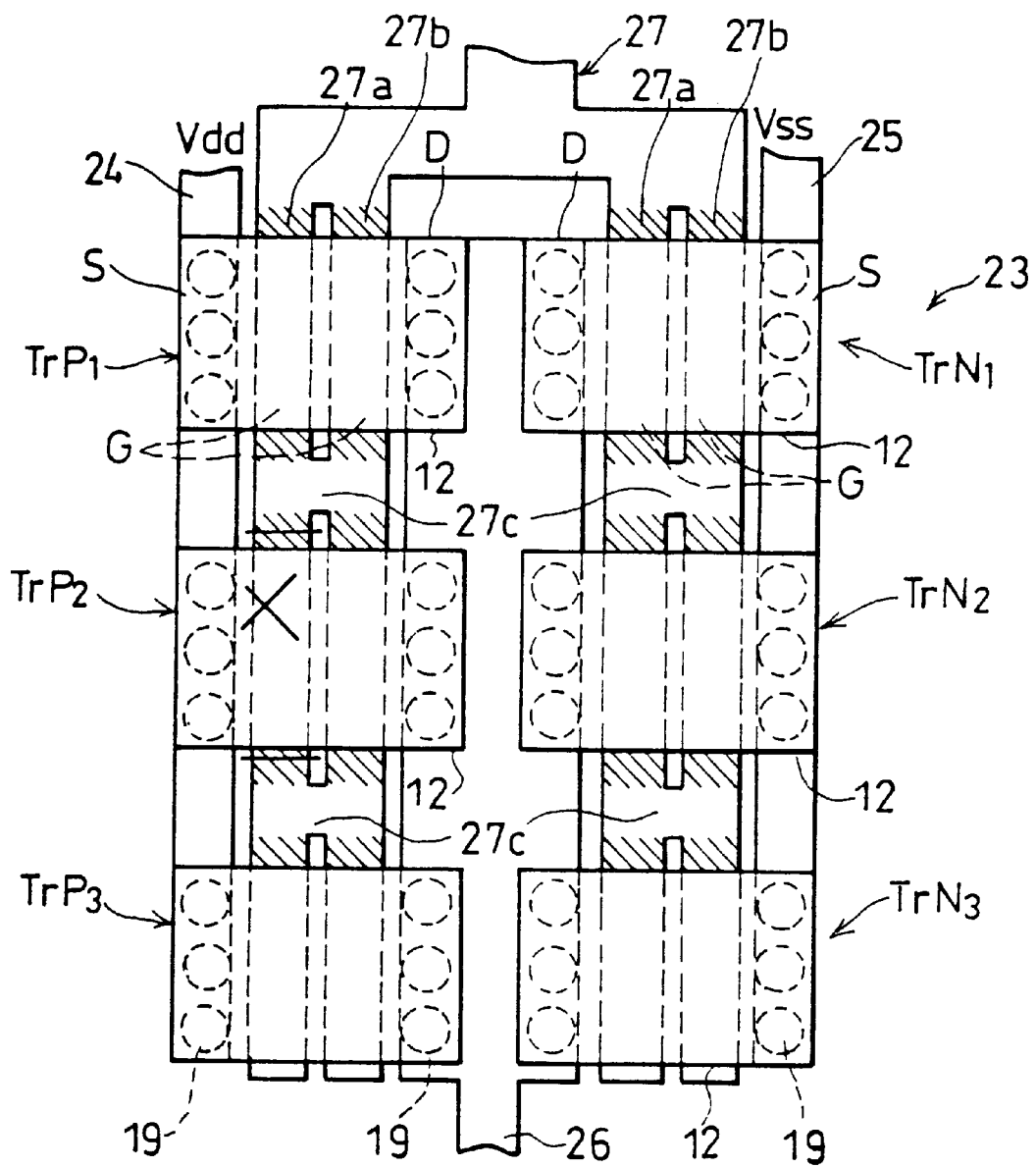
FIG. 7 is a plan view of the buffer shown in FIG. 6 from which the defective portion has been eliminated, taken from the side of the back surface of the substrate excluding the substrate and an insulating film.
Figure 8:
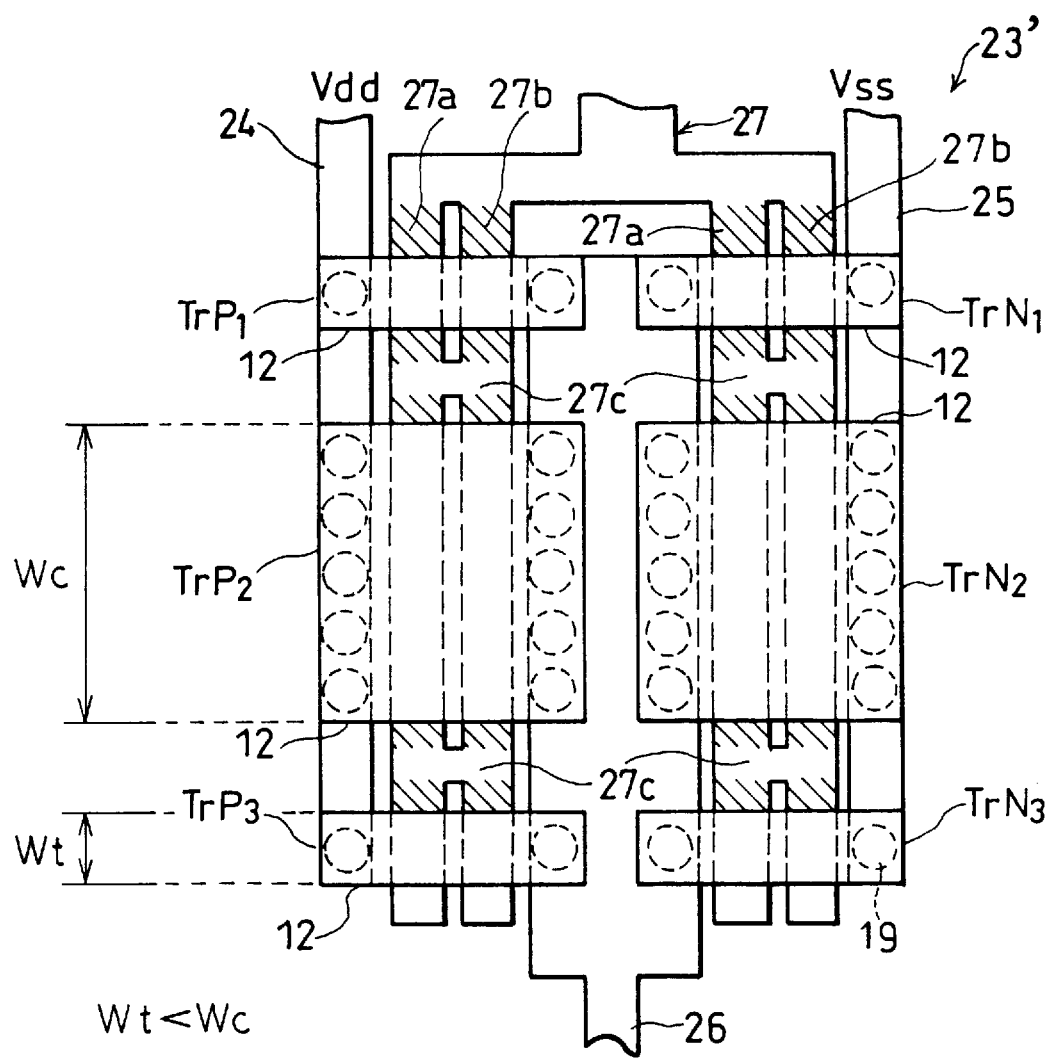
FIG. 8 shows still another embodiment of the present invention, and is a plan view of a buffer of a driving circuit deposited on a substrate of a driving circuit integrated type liquid crystal display device taken from the side of a back surface of the substrate excluding the substrate and an insulating film.

The following descriptions will discuss another embodiment of the present invention in reference to FIG. 6 through FIG. 8. Here, members having the same function as those of the first embodiment will be designated by the same reference numerals, and thus the descriptions thereof shall be omitted here.

A driving circuit integrated type active-matrix liquid crystal display device in accordance with the present embodiment includes a buffer 23 shown in FIG. 6. In the buffer 23, P-channel thin film transistors $TrP_1$ through $TrP_3$ and N-channel thin film transistors $TrN_1$ through $TrN_3$ are respectively multi-gate thin film transistors which serve as dual gates.

The buffer 23 is arranged such that a power source line 24 on the side of a high potential power source Vdd connected to respective thin film transistors $TrP_1$ through $TrP_3$, a power source line 25 on the side of a low potential power source Vss connected to respective thin film transistors $TrN_1$ through $TrN_3$ and an output line 26 connected to respective thin film transistors $TrP_1$ through $TrP_3$ and $TrN_1$ through $TrN_3$ are connected in series without branched wiring sections.

Namely, t he power source lines 24 and 25 include the sources S of respective thin film transistors $TrP_1$ through $TrP_3$, and $TrN_1$ through $TrN_3$ as a part of the wiring thereof. The power source lines 24 and 25 are straight line wirings formed parallel to each other. The output line 26 is a straight line wiring including the drains D of respective thin film transistors $TrP_1$ through $TrP_3$, and $TrN_1$ through $TrN_3$ as a part of the wiring. The output lines 26 is formed parallel to the power source lines 24 and 25.

In contrast, the gate line 27 of each channel is formed in a wiring pattern of ladder shaped shape composed of divided wiring portions 27a and 27b that are divided based on the dual gates G of the respective transistors $TrP_1$ through $TrP_3$ and a connecting wiring section 27c for connecting the divided wiring section 27a and the divided wiring section 27b between respective thin film transistors.

The divided wiring sections 27a and 27b are straight line wiring sections formed parallel to the power source lines 24 and 25, and are integrally formed with respective gates G. One end of each of the divided wiring section 27a and 27b is connected to the shift register 9.

In the liquid crystal display device provided with the buffer 23 of the described arrangement, a line-shaped defect due to a defect with regard to the gate line such as a leakage generated between the gate and the source and a leakage generated between the gate and the drain can be eliminated.

First, it is detected where the defect is generated in the aforementioned manner. Here, as shown in FIG. 7, upon detecting a defect (leakage generated between the gate and the source) generated at a portion marked with x in the P-channel thin film transistor $TrP_2$, the divided wiring sections 27a connected to the defective divided wiring section is cut off at the portion shown by the hatching on both sides of the thin film transistor $TrP_2$, for example, by projecting thereto a laser beam, so as to separate the defective thin film transistor $TrP_2$.

Even after the divided wiring section 27a is cut off by the described manner, a gate signal can be still sent to the plurality of gates of the secondary thin film transistors $TrP_3$, through the remaining divided wiring section 27b without being cut off and the connecting wiring portion 27c, thereby preventing an effect on the secondary thin film transistor $TrP_3$.

Namely, as the defective thin film transistor $TrP_2$ is cut off, the buffer 23 can output a normal signal using the remaining two P-channel thin film transistors $TrP_1$ and $TrP_3$ and three N-channel thin film transistors $TrN_1$ through $TrN_3$, thereby eliminating the line-shaped defect.

The explanations have been given through the case of separating the thin film transistor $TrP_2$ to eliminate a defect generated therein. However, a defective thin film transistor can be eliminated in the described manner even when a defect is generated in any other thin film transistors $TrP_1$, $TrP_3$, $TrN_1$, $TrN_2$ and $TrN_3$.

In the arrangement of the present embodiment, it is preferable to select the channel width Wc of respective thin film transistors $TrP_1$ through $TrP_3$, and $TrN_1$ through $TrN_3$ so that they can be properly operated as the buffer 23 for the video signal driving circuit 1 and scanning signal driving circuit 2 even with the remaining two P-channel thin film transistors or two N-channel thin film transistors.

It has been found that among a plurality of thin film transistors connected in parallel in each channel, an electrostatic breakdown is more likely to occur in the thin film transistors at the end sides than the thin film transistors on the inner side. Therefore, the buffer 23' shown in FIG. 8 may be adopted wherein among three P-channel thin film transistors $TrP_1$ through $TrP_3$ and three N-channel thin film transistors $TrN_1$ through $TrN_3$, the thin film transistors $TrP_1$ $TrP_3$, $TrN_1$ and $TrN_3$ are used as dummy transistors by setting the channel width Wt of the thin film transistors $TrP_1$, $TrP_3$, $TrN_1$ and $TrN_3$ formed on both sides smaller than the channel width $W_c$ of other thin film transistors $TrP_2$ and $TrN_2$.

The described arrangement offers an effect of reducing the size of the buffer in addition to the effect of permitting an elimination of a line-shaped defect.

Fourth Embodiment

Figure 9:
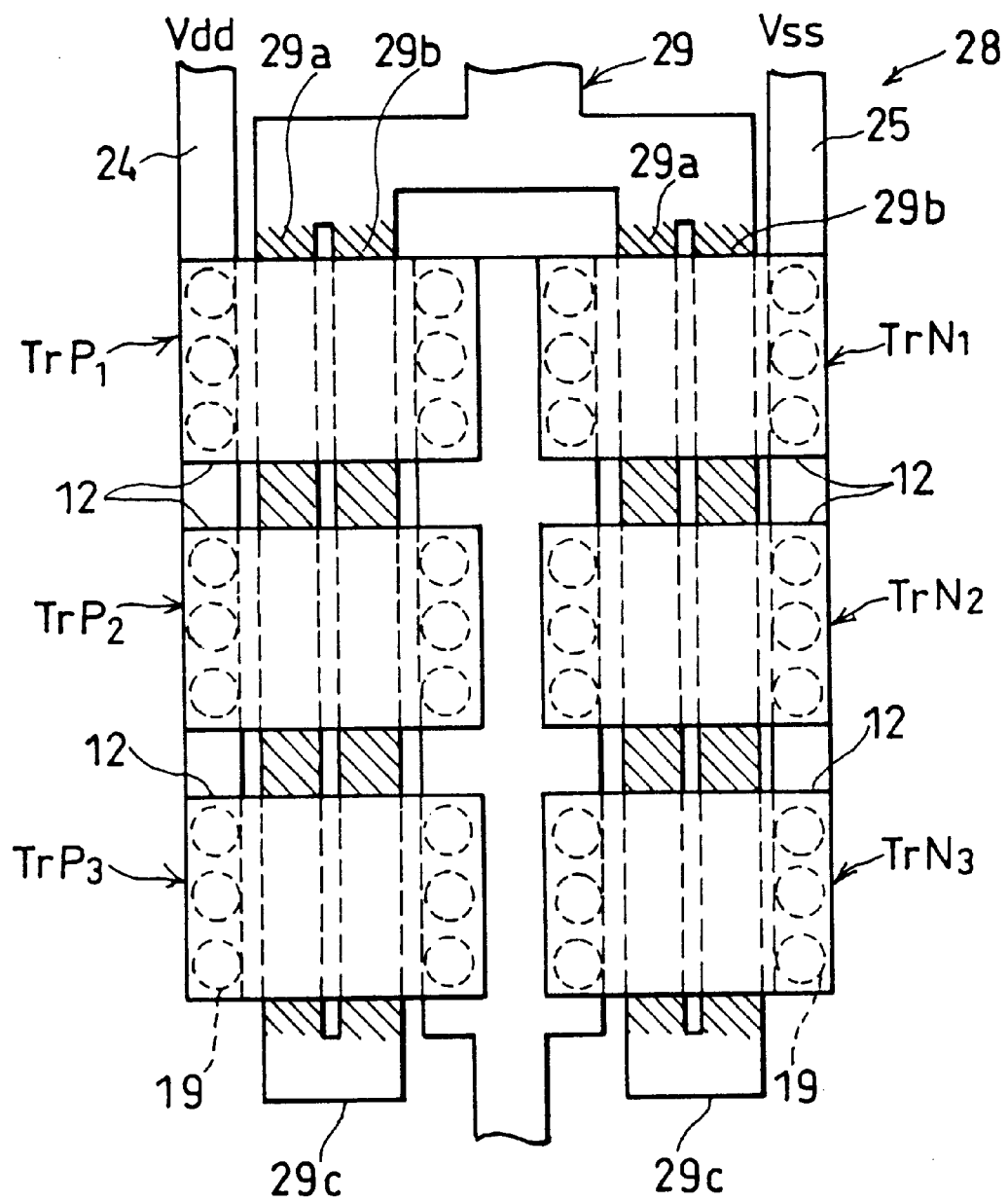
FIG. 9 shows still another embodiment of the present invention, and is a plan view of a buffer of a driving circuit deposited on a substrate of a driving circuit integrated type liquid crystal display device taken from the side of the back surface of the substrate excluding the substrate and an insulating film.
Figure 10:
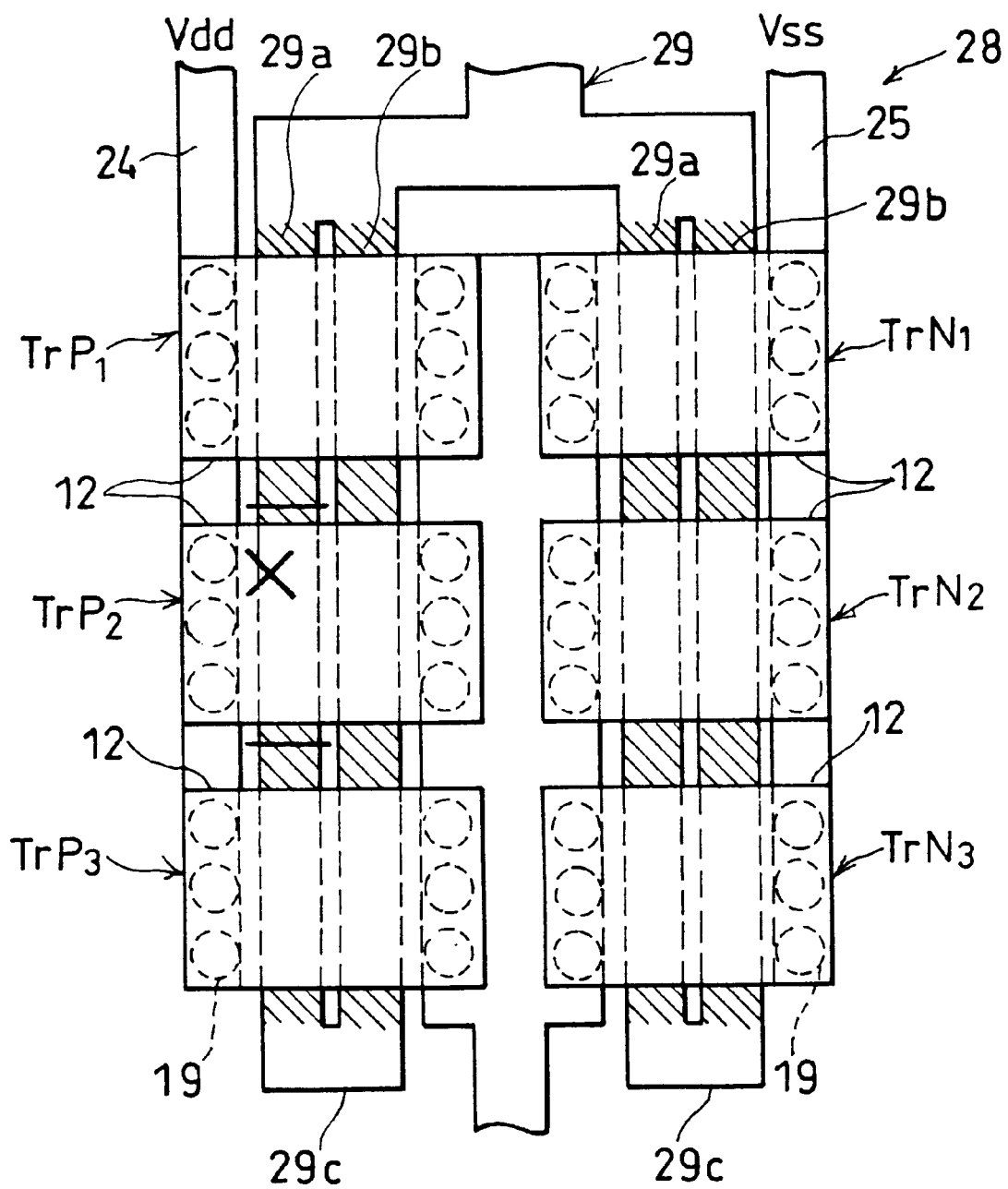
FIG. 10 is a plan view of the buffer shown in FIG. 9 from which the defective portion has been eliminated taken from the side of the back surface of the substrate excluding the substrate and the insulating film.

The following descriptions will discuss another embodiment of the present invention in reference to FIG. 9 and FIG. 10. Here, members having the same function as those of the third embodiment will be designated by the same reference numerals, and thus the descriptions thereof shall be omitted here.

A driving circuit integrated type active-matrix liquid crystal display in accordance with the present embodiment includes a buffer 28 shown in FIG. 9.

In the buffer 28, a gate line 29 of each channel has a ring-shaped structure in which a connecting wiring section 29c for connecting divided wiring sections 29a and 29b is disposed at the ends of the divided wiring sections 29a and 29b with respect to the divided wiring sections 29a and 29b divided in accordance with the dual gates G of the respective thin film transistors $TrP_1$ through $TrP_3$ and $TrN_1$ through $TrN_3$. Namely, the straight line divided wiring sections 29a and 29b of each channel are formed parallel to the power source lines 24 and 25. The divided wiring portions 29a and 29b are integrally formed with the respective gates G of each thin film transistor ($TrP_1$ through $TrP_3$, or $TrN_1$ through $TrN_3$) on the channel side. In the state where one end of the divided wiring section 29a and one end of the divided wiring section 29b are connected, they are connected to the shift register 9 to form an input terminal. Moreover, the divided wiring sections 29a and the divided wiring sections 29b of each channel are respectively connected by the connecting wiring portion 29c to form a ring-shaped structure at the ends on the opposite side of the input terminal.

By forming in the described ring-shaped wiring pattern, the distance between the thin film transistors ($TrP_1$ through $TrP_3$ or $TrN_1$ through $TrN_3$) of each channel can be set shorter than the ladder shaped wiring pattern adopted in the gate line 27 of the third embodiment. This offers an effect of reducing the size of the buffer.

The described arrangement of the present embodiment also offers the effect of the third embodiment, i.e., the line shaped defect due to the defect with regard to the gate line such as a leakage generated between the gate and the source, a leakage between the gate and the drain, etc., can be eliminated.

For example, upon detecting a defect (leakage generated between the gate and the source) generated at a portion marked with x in the P-channel thin film transistor $TrP_2$, of FIG. 10 the defective divided wiring section 29a is cut off at the portion shown by the hatching on both sides of the defective thin film transistor $TrP_2$, for example, by projecting thereto a laser beam so as to separate the defective thin film transistor $TrP_2$, thereby eliminating the line-shaped defect.

In the arrangement of the present embodiment, it is preferable to select the channel width of respective thin film transistors $TrP_1$ through $TrP_3$, and $TrN_1$ through $TrN_3$ so that they can be properly operated as the buffer 28 for the video signal driving circuit 1 and scanning signal driving circuit 2 even with the remaining two P-channel thin film transistors and two N-channel thin film transistors.

Fifth Embodiment

Figure 11:
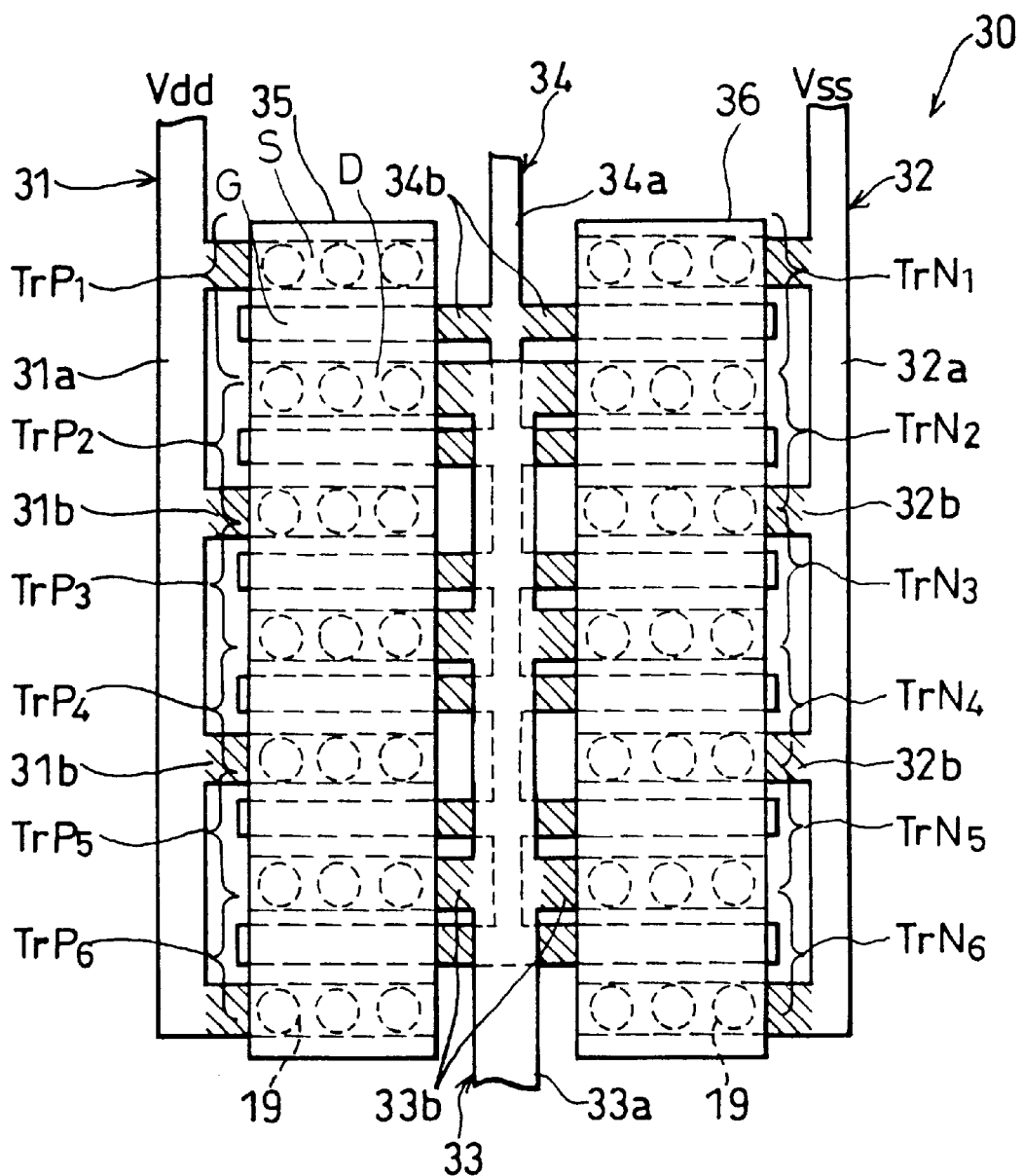
FIG. 11 shows still another embodiment of the present invention, and is a plan view of a buffer of a driving circuit deposited on a substrate which constitutes a driving circuit integrated type liquid crystal display device taken from the side of a back surface of the substrate excluding the substrate and the insulating film.
Figure 12:
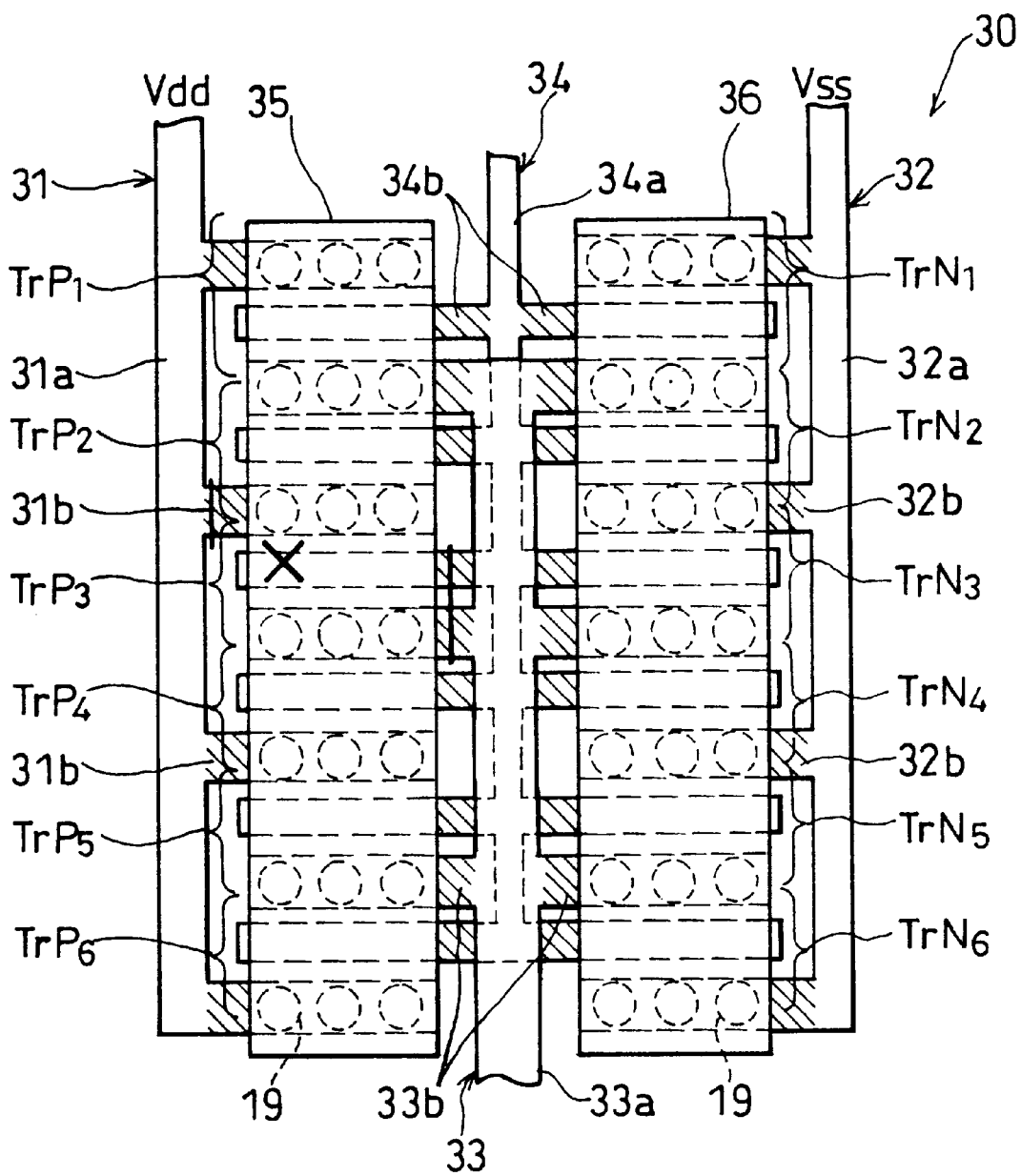
FIG. 12 is a plan view of the buffer shown in FIG. 11 from which the defective portion has been eliminated taken from the side of the back surface of the substrate excluding the substrate and the insulating film.
Figure 13:
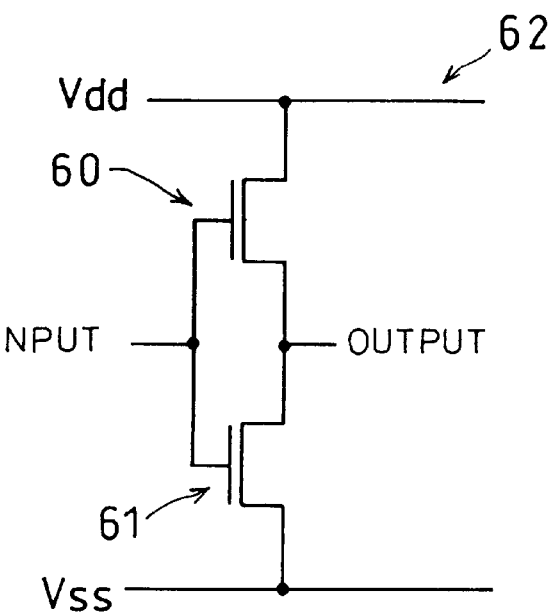
FIG. 13 shows a circuit diagram of a conventional buffer.
Figure 14:
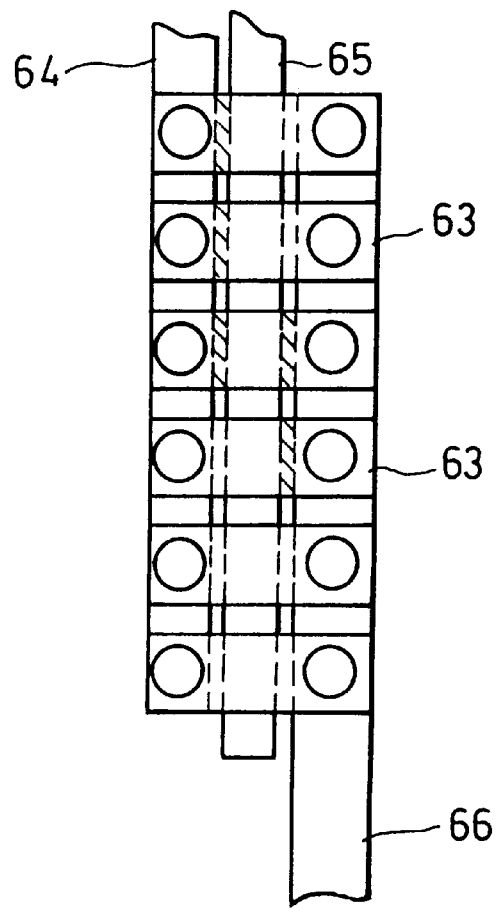
FIG. 14 shows a plan view of a conventional video signal wiring switch thin film transistor.

The following descriptions will discuss another embodiment of the present invention in reference to FIG. 11 and FIG. 12. Here, members having the same function as those of the first embodiment will be designated by the same reference numerals, and thus the descriptions thereof shall be omitted here.

A driving circuit integrated type active-matrix liquid crystal display in accordance with the present embodiment includes a buffer 30 shown in FIG. 11.

The buffer 30 includes a P-channel thin film transistor and an N-channel thin film transistor which are connected in series between a power source line 31 connected to a high potential power source Vdd and a power source line 32 connected to a low potential power source Vss.

In the present embodiment, the P-channel thin film transistor is composed of six P-channel thin film transistors $TrP_1$ through $TrP_6$ connected in parallel by a plurality of semiconductor pieces 35 that are formed in one integral part. On the other hand, the N-channel thin film transistor is composed of six N-channel thin film transistors $TrN_1$ through $TrN_6$ connected in parallel by using a piece of semiconductor 36.

The semiconductor pieces 35 and 36 respectively includes six gates G, and four sources S and three drains D that are alternatively formed between the gates G and to the outside of the end sides of the gates G. Here, the sources S and the drains D provided between the gates G of the respective semiconductor pieces 35 and 36 are used in common between the two adjacent thin film transistors.

The power source lines 31 and 32 of the buffer connected to the sources S of the six thin film transistors $TrP_1$ through $TrP_1$ and $TrN_1$ through $TrN_6$ are formed by a wiring pattern composed of the main wiring sections 31a and 32a and the branched wiring sections 31b and 32b respectively branched from the main wiring sections 31a and 32a. The main wiring sections 31a and 32a form a straight line wiring section which is not in contact with the respective thin film transistors $TrP_1$ through $TrP_3$ and $TrN_1$ through $TrN_6$. The respective ends on one side of the main wiring sections 31a and 32a are connected to the power sources Vdd and Vss respectively. The branched wiring sections 31b and 32b are straight line wiring portions formed so as to cross the main wiring sections 31a and 32a at right angle.

The output line 33 of the buffer connected to the drain D of the respective six thin film transistors $TrP_1$ through $TrP_6$ and $TrN_1$ through $TrN_6$ is formed in a wiring pattern composed of the main wiring section 33a and the branched wiring sections 33b branched from the main wiring section 33a. The main wiring section 33a is a straight line wiring section formed parallel to the main wiring sections 31a and 32a. The main wiring section 33a is not in contact with the respective thin film transistors $TrP_1$ through $TrP_3$ and $TrN_1$ through $TrN_6$ One end of the main wiring section 33a serves as an output terminal. Each branched wiring section 33b is a straight line wiring section formed so as to cross the main wiring section 33a at right angle.

The gate line 34 of the buffer connected to the gates G of respective six thin film transistors $TrP_1$ through $TrP_6$ an d $TrN_1$ through $TrN_6$ is formed in a wiring pattern composed of the main wiring section 34a and the branched wiring sections 34b branched from the main wiring section 34a. The main wiring section 34a is formed parallel to the main wiring sections 31a and 32a, and is a straight line wiring section which is not in contact with the respective thin film transistors $TrP_1$ through $TrP_3$ and $TrN_1$ through $TrN_6$. One end of the main wiring section 34a serves as an input terminal. Each branched wiring section 34b is a straight line wiring section formed so as to cross the main wiring section 34a at right angle. The gate line 34 is not in contact with the output line 33.

The described arrangement permits a line-shaped defect due to any type of defect to be eliminated.

For example, as shown in FIG. 12, upon detecting a defect in the P-channel thin film transistor $TrP_3$ of the buffer 23 by the aforementioned method, the respective branched wiring sections 31b, 33b and 34b that are connected to the defective thin film transistor $TrP_3$ are cut off, for example, by projecting thereto a laser beam so as to separate the detective thin film transistor $TrP_3$.

In this case, as the P-channel thin film transistors $TrP_2$, $TrP_4$ and the defective thin film transistor $TrP_3$ use the source and the drain in common, they are cut off at this time. However, a normal signal can be still outputted using the remaining three thin film transistors $TrP_1$, $TrP_5$ and $TrP_6$ and the six thin film transistors $TrN_1$ through $TrN_6$ of the N-channel, thereby eliminating the line-shaped defect.

In the described arrangement of the present embodiment, it is preferable to select the channel width of respective thin film transistors $TrP_1$ through $TrP_6$, and $TrN_1$ through $TrN_6$ so that they can be properly operated as the buffer 30 for the video signal driving circuit 1 and scanning signal driving circuit 2 even with the remaining three P-channel thin film transistors and three N-channel thin film transistors.

In the cut-off pattern shown in FIG. 12, the power source line 31, the output line 33 and the gate line 34 which are connected to the defective thin film transistor $TrP_3$ are all cut off at the portions of respective branched wiring sections 31b, 33b and 34b. Therefore, the cut-off pattern adopted in the present invention can be applied to any type of defect. For example, in the case of generating a leakage between the gate and the source, the line-shaped defect can be eliminated by cutting off either of the branched wiring sections 31b and 34b in the power source line 31 or the gate line 34. Similarly, upon detecting a leakage generated between the gate and the drain, the line-shaped defect can be eliminated by separating the defective thin film transistor $TrP_3$ by cutting off either one of the output line 33 or the branched lines 33b and 34b of the gate line 34.

In consideration of the above, when it is determined that a leakage is likely to generate between the gate and the drain, it may be arranged so as to form only either one of the output line 33 or the gate line 34 in the described wiring pattern. Namely, it is permitted to form either one of the lines in the described pattern in consideration of the type of defect that is most likely to generate.

Furthermore, the arrangement of the present embodiment where a plurality of thin film transistors $TrP_1$ through $TrP_6$ and $TrN_1$ through $TrN_6$ are formed by the semiconductor pieces 35 and 36 offers an effect that the buffer can be small-sized compared with the arrangement where the semiconductors which constitute the thin film transistors are independently provided.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of the instant contribution to the art and, therefore, such adaptations should and are intended to be comprehended within the meaning and range of equivalence of the appended claims.

What is claimed is:

1. A liquid crystal display device provided with a driving circuit deposited on a substrate having formed thereon a plurality of display pixel sections, said driving circuit being provided for driving the display pixel sections, wherein:

said driving circuit includes a buffer composed of a P-channel thin film transistor and an N-channel thin film transistor that are connected in series, at least one of said P-channel thin film transistor and said N-channel thin film transistor is composed of a plurality of thin film transistors that are connected in parallel between a power source line and an output line, and at least one of said power source line and said output line is formed in a wiring pattern composed of a main wiring section and branched wiring sections branched into respective thin film transistors, so that when any of said plurality of thin film transistors connected in parallel becomes defective, a thin film transistor which has become defective is alone disconnectable from one of said power source line and said output line.

2. The liquid crystal display device as set forth in claim 1, wherein:

said thin film transistors connected to the branched wiring sections each include a contact for connecting a branched wiring section and a semiconductor layer, and said branched wiring sections are disposed between said main wiring section and a contact.

3. The liquid crystal display device as set forth in claim 1, wherein:

a gate line connected to said buffer includes gate electrode sections disposed in said thin film transistors and intermediate wiring sections for connecting between gate electrode sections of said thin film transistors, and said intermediate wiring sections are composed of a thin film layer that is different from a thin film layer adopted in said gate electrode sections, and are connected to the gate electrode sections via through holes in a vicinity of main bodies of said thin film transistors.

4. The liquid crystal display device as set forth in claim 2, wherein:

a gate line connected to said buffer includes gate electrode sections disposed in said thin film transistors and intermediate wiring sections for connecting between gate electrode sections of said thin film transistors, and said intermediate wiring sections are composed of a thin film layer that is different from a thin film layer adopted in said gate electrode sections, and the thin film layer of said intermediate wiring sections are in contact with the thin film layer of said gate electrode sections in a vicinity of main bodies of said thin film transistors, with a contact surface therebetween parallel to said surface.

5. The liquid crystal display device as set forth in claim 1, wherein:

at least one of said P-channel thin film transistor and said N-channel thin film transistor is composed of at least three thin film transistors connected in parallel, and among said at least three thin film transistors, thin film transistors disposed at end sides have a channel width smaller than a channel width of other thin film transistors.

6. The liquid crystal display device as set forth in claim 1, wherein:

said P-channel thin film transistor has a source connected to a high potential power source, a gate to which a signal from a shift register is input and a drain from which a signal for driving a pixel display section is output, and said N-channel thin film transistor has a source connected to a low potential power source, a gate to which a signal is input from a shift register and a drain from which a signal for driving a pixel display section is output.

7. The liquid crystal display device as set forth in claim 1, wherein:

said branched wiring sections have a width in a range of from 2 $\mu$m to ½ of a channel width of said thin film transistors to which said branched wiring sections are connected.

8. A liquid crystal display device provided with a driving circuit deposited on a substrate having formed thereon a plurality of display pixel sections, said driving circuit being provided for driving the display pixel sections, wherein:

said driving circuit includes a buffer composed of a P-channel thin film transistor and an N-channel thin film transistor that are connected in series, at least one of said P-channel thin film transistor and said N-channel thin film transistor is composed of a plurality of thin film transistors that are connected in parallel between a power source line and an output line, said plurality of thin film transistors connected in parallel respectively include a plurality of gates said plurality of gates being interconnected through a gate line, and said gate line is formed in a wiring pattern composed of divided wiring sections that are divided for respective gates and a connecting wiring section for connecting respective divided wiring sections provided between respective thin film transistors, so that when a gate of any of said plurality of thin film transistors connected in parallel becomes defective, a gate which has become defective is alone disconnectable from said gate line.

9. The liquid crystal display device as set forth in claim 8, wherein:

said gate line connected to said buffer includes gate electrode sections disposed in said thin film transistors and intermediate wiring sections for connecting between said gate electrode sections of said thin film transistors, and said intermediate wiring sections are composed of a thin film layer that is different from a thin film layer adopted in said gate electrode sections, and the thin film layer of said intermediate wiring sections are in contact with the thin film layer of said gate electrode sections in a vicinity of main bodies of said thin film transistors, with a contact surface therebetween parallel to said substrate.

10. The liquid crystal display device as set forth in claim 8, wherein:

at least one of said P-channel thin film transistor and said N-channel thin film transistor is composed of at least three thin film transistors connected in parallel, and among said at least three thin film transistors, thin film transistors disposed at end sides have a channel width smaller than a channel width of other thin film transistors.

11. The liquid crystal display device as set forth in claim 8, wherein:

said P-channel thin film transistor has a source connected to a high potential power source through a first power source line, a gate to which a signal from a shift register is input through said gate line and a drain from which a signal for driving a pixel display section is output through said output line, and said N-channel thin film transistor has a source connected to a low potential power source through a second power source line, a gate to which a signal is input from a shift register through said gate line and a drain from which a signal for driving a pixel display section is output through said output line.

12. A liquid crystal display device provided with a driving circuit deposited on a substrate having formed thereon a plurality of display pixel sections, said driving circuit being provided for driving the display pixel sections, wherein:

said driving circuit includes a buffer composed of a P-channel thin film transistor and an N-channel thin film transistor that are connected in series, at least one of said P-channel thin film transistor and said N-channel thin film transistor is composed of a plurality of thin film transistors that are connected in parallel between a power source line and an output line, said plurality of thin film transistors connected in parallel respectively include a plurality of gates, said plurality of gates being interconnected through a gate line, and said gate line for connecting said plurality of gates is formed in a wiring pattern composed of divided wiring sections that are divided for respective gates and a connecting wiring section for connecting respective terminal ends of the divided wiring sections, so that when a gate of any of said plurality of thin film transistors connected in parallel becomes defective, a gate which has become defective is alone disconnectable from said gate line.

13. The liquid crystal display device as set forth in claim 12, wherein:

said gate line connected to said buffer includes gate electrode sections disposed in said thin film transistors and intermediate wiring sections for connecting between said gate electrode sections of said thin film transistors, and said intermediate wiring sections are composed of a thin film layer that is different from a thin film layer adopted in said gate electrode sections, and the thin film layer of said intermediate wiring sections are in contact with the thin film layer of said gate electrode sections in a vicinity of main bodies of said thin film transistors, with a contact surface therebetween parallel to said substrate.

14. The liquid crystal display device as set forth in claim 12, wherein:

at least one of said P-channel thin film transistor and said N-channel thin film transistor is composed of at least three thin film transistors connected in parallel, and among said at least three thin film transistors, thin film transistors disposed at end sides have a channel width smaller than a channel width of other thin film transistors.

15. The liquid crystal display device as set forth in claim 12, wherein:

said P-channel thin film transistor has a source connected to a high potential power source through a first power source line, a gate to which a signal from a shift register is input through said gate line and a drain from which a signal for driving a pixel display section is output through said output line, and said N-channel thin film transistor has a source connected to a low potential power source through a second power source line, a gate to which a signal is input from a shift register through said gate line and a drain from which a signal for driving a pixel display section is output through said output line.

16. A liquid crystal display device provided with a driving circuit deposited on a substrate having formed thereon a plurality of display pixel sections, said driving circuit being provided for driving the display pixel sections, wherein:

said driving circuit includes a buffer composed of a P-channel thin film transistor and an N-channel thin film transistor that are connected in series, at least one of said P-channel thin film transistor and said N-channel thin film transistor is composed of a plurality of thin film transistors that are connected in parallel between a power source line and an output line, said plurality of thin film transistors connected in parallel are formed by a plurality of semiconductor pieces that are formed in one integral part, and at least one of said power source line, said output line and a gate line is formed in a wiring pattern composed of a main wiring section and a branched wiring section branched into respective thin film transistors from the main wiring section, so that when any of said plurality of thin film transistors connected in parallel becomes defective, a thin film transistor which has become defective is alone disconnectable from one of said power source line, said output line and said gate line.

17. The liquid crystal display device as set forth in claim 16, wherein:

said thin film transistors connected to the branched wiring section each include a contact for connecting the branched wiring section and a semiconductor layer, and said branched wiring section is disposed between said main wiring section and to a contact.

18. The liquid crystal display device as set forth in claim 16, wherein:

a gate line connected to said buffer includes gate electrode sections disposed in said thin film transistors and intermediate wiring sections for connecting between gate electrode sections of said thin film transistors, and said intermediate wiring sections are composed of a thin film layer that is different from a thin film layer adopted in said gate electrode sections, and the thin film layer of said intermediate wiring sections are in contact with the thin film layer of said gate electrode sections in a vicinity of main bodies of said thin film transistors, with a contact surface therebetween parallel to said substrate.

19. The liquid crystal display device as set forth in claim 16, wherein:

said P-channel thin film transistor has a source connected to a high potential power source through a first power source line, a gate to which a signal from a shift register is input through said gate line and a drain from which a signal for driving a pixel display section is output through said output line, and said N-channel thin film transistor has a source connected to a low potential power source through a second power source line, a gate to which a signal is input from a shift register through said gate line and a drain from which a signal for driving a pixel display section is output through said output line.

* * * * *